US011387813B2

(12) United States Patent
Ting et al.

(10) Patent No.: US 11,387,813 B2
(45) Date of Patent: Jul. 12, 2022

(54) FREQUENCY MULTIPLIER AND DELAY-REUSED DUTY CYCLE CALIBRATION METHOD THEREOF

(71) Applicant: MEDIATEK INC., Hsin-Chu (TW)

(72) Inventors: Hsiu-Hsien Ting, Hsinchu (TW); Po-Chun Huang, Hsinchu (TW); Yu-Li Hsueh, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 17/241,044

(22) Filed: Apr. 26, 2021

(65) Prior Publication Data

US 2022/0069809 A1 Mar. 3, 2022

Related U.S. Application Data

(60) Provisional application No. 63/070,349, filed on Aug. 26, 2020.

(51) Int. Cl.
*H03K 3/017* (2006.01)
*H03K 5/00* (2006.01)
(Continued)

(52) U.S. Cl.
CPC ............... *H03K 3/017* (2013.01); *G06F 1/08* (2013.01); *H03K 5/00006* (2013.01); *H03K 19/20* (2013.01); *H03K 2005/00078* (2013.01)

(58) Field of Classification Search
CPC ........ H03K 5/135; H03K 5/133; H03K 5/131; H03K 5/1565; H03K 3/017;
(Continued)

(56) References Cited

U.S. PATENT DOCUMENTS 5,963,071 A 10/1999 Dowlatabadi
6,452,432 B2 9/2002 Kim
(Continued)

FOREIGN PATENT DOCUMENTS

CN 103312299 A 9/2013
TW 202020604 A 6/2020

OTHER PUBLICATIONS

Mohammad Mahdi Ghahramani, Yashar Rajavi, Alireza Khalili, Amirpouya Kavousian, Beomsup Kim, Michael P. Flynn, "A 192MHz Differential XO Based Frequency Quadrupler with SubPicosecond Jitter in 28nm CMOS", RFIC, 2015, IEEE, USA.
(Continued)

*Primary Examiner* — John W Poos
(74) *Attorney, Agent, or Firm* — Winston Hsu

(57) ABSTRACT

A frequency multiplier and a delay-reused duty cycle calibration method thereof are provided. The frequency multiplier includes a first calibration circuit, a second calibration circuit and a controller. In a calibration mode of the frequency multiplier, an output terminal of a delay cell is coupled to an input terminal of the delay cell. The first calibration circuit repeatedly uses the delay cell M times for generating a first delayed signal. The controller controls the delay cell according to the first delayed signal, to find a delay of the delay cell which makes M times the delay be equal to one cycle period of an input clock signal. After the delay is found, the delay cell is repeatedly used M/2 times for generating a second delayed signal. The controller controls the second calibration circuit according to the second delayed signal to make an input calibration signal have a target duty cycle.

22 Claims, 14 Drawing Sheets

(51) Int. Cl.
*H03K 19/20* (2006.01)
*G06F 1/08* (2006.01)

(58) Field of Classification Search
CPC .. H03K 5/00006; H03K 19/20; H03L 7/0805; H03L 7/0814; H03L 7/0812
See application file for complete search history.

(56) References Cited

U.S. PATENT DOCUMENTS

| | | | | |
|---|---|---|---|---|
| 7,839,194 | B2 | 11/2010 | Chang | |
| 8,783,185 | B2 | 7/2014 | Jacobsen | |
| 8,878,582 | B2 * | 11/2014 | Hsueh | H03K 3/017 327/175 |
| 2010/0225372 | A1 * | 9/2010 | Satoh | H03L 7/0816 327/175 |
| 2012/0218015 | A1 * | 8/2012 | Satoh | H03L 7/0816 327/158 |
| 2013/0229216 | A1 * | 9/2013 | Wu | H03K 5/1565 327/175 |
| 2016/0099729 | A1 | 4/2016 | Rajavi | |

OTHER PUBLICATIONS

Karim M. Megawer, Ahmed Elkholy, Mostafa Gamal Ahmed, Ahmed Elmallah, Pavan Kumar Hanumolu, "Design of Crystal-Oscillator Frequency Quadrupler for Low-Jitter Clock Multipliers", JSSC, IEEE, USA. ,Jan. 2019.

Fei Song, Yu Zhao, Bart Wu, Litian Tang, Leon Lin, Behzad Razavi, "A Fractional-N Synthesizer with 110fsrms Jitter and a Reference Quadrupler for Wideband 802.11ax", ISSCC , 2019, IEEE, USA.

* cited by examiner

FREQUENCY MULTIPLIER AND DELAY-REUSED DUTY CYCLE CALIBRATION METHOD THEREOF

CROSS REFERENCE TO RELATED APPLICATIONS

This application claims the benefit of U.S. provisional application No. 63/070,349, which was filed on Aug. 26, 2020, and is included herein by reference.

BACKGROUND

The present invention is related to duty cycle calibration, and more particularly, to a frequency multiplier and a delay-reused duty cycle calibration method thereof.

To implement a frequency doubler, a reference signal needs to be delayed by 25% cycle period of the reference signal for generating a delayed signal, and an output signal with a doubled frequency can be generated based on the reference signal and the delayed signal. In order to minimize output spurs, a precise 50% duty cycle of the output signal is required, which means the aforementioned 25% cycle period delay needs to be precisely generated. Some related arts adopt different approaches to generate this 25% cycle period delay. More particularly, analog building blocks, such as loop filters, comparators, passive devices (e.g. resistors or comparators), a skew inverter or an operational amplifier, are utilized in the related arts.

Advanced process such as 22 nm, 16 nm, 12 nm, 7 nm, etc. provides some advantages such as less gate delay, higher operating speed and less circuit area. There are some disadvantages, however. The advanced process may be expensive. Furthermore, analog design using the advanced processes may be challenging, and more particularly, may occupy a large area and be hard to optimize performance. In addition, the analog building blocks mentioned above, which are utilized to generate the aforementioned 25% cycle period delay, may suffer some problems in the related art. For example, loop filters and passive devices may occupy large areas, comparator offset and device mismatch may degrade the precision of the generated delay, the skew inverter may suffer phase noise, and the operational amplifier is hard to be shrunk in the advanced processes.

Thus, there is a need for a novel method and associated architecture, which are able to generate the aforementioned 25% cycle period delay by all digital circuit, in order to prevent suffering analog design issues mentioned above, and fully take advantages of the advanced process.

SUMMARY

This in mind, an objective of the present invention is to provide a frequency multiplier and a delay-reused duty cycle calibration method thereof, to solve the problem of the related art without introducing any side effect or in a way that is less likely to introduce side effects.

At least one embodiment of the present invention provides a frequency multiplier. The frequency multiplier may comprise a first calibration circuit, a second calibration circuit, and a controller coupled to the first calibration circuit and the second calibration circuit. The first calibration circuit may comprise a first delay cell configured to provide a first delay. The second calibration circuit is configured to generate the input calibration signal according to an input clock signal. In a calibration mode of the frequency multiplier, an output terminal of the first delay cell is coupled to an input terminal of the first delay cell, the first delay cell is repeatedly used M times for delaying an input calibration signal or a derivative thereof by M times the first delay, to generate a first delayed signal, and M is a predetermined positive integer. In addition, the controller controls the first delay according to the first delayed signal, to find a target delay which makes M times the target delay be equal to one cycle period of an input clock signal; after the target delay is found, the first delay cell is repeatedly used M/2 times for delaying the input calibration signal or the derivative thereof by M/2 times the target delay, to generate a second delayed signal; and the controller controls the second calibration circuit according to the second delayed signal to make the input calibration signal have a target duty cycle.

At least one embodiment of the present invention provides a delay-reused duty cycle calibration method. The delay-reused duty cycle calibration method may comprise: coupling an output terminal of a first delay cell to an input terminal of the first delay cell by a first calibration circuit, wherein the first calibration circuit comprises the first delay cell, the first delay cell is configured to provide a first delay, and the first delay cell is repeatedly used M times for delaying an input calibration signal or a derivative thereof by M times the first delay, to generate a first delayed signal, wherein M is a predetermined positive integer; controlling the first delay by a controller according to the first delayed signal, to find a target delay of the first delay cell which makes M times the target delay be equal to one cycle period of an input clock signal, wherein the input calibration signal is generated by a second calibration circuit according to the input clock signal; after the target delay is found, repeatedly using the first delay cell M/2 times for delaying the input calibration signal or the derivative thereof by M/2 times the target delay, to generate a second delayed signal; and controlling the second calibration circuit according to the second delayed signal to make the input calibration signal have a target duty cycle.

The embodiments of the present invention can make the first delay cell be repeatedly used M times for obtaining a precise time interval corresponding to 1/M times the cycle period of the input clock signal, and the first delay cell is further repeatedly used M/2 times, M/4 times and M/8 times to generate precise time intervals corresponding to 50%, 25% and 12.5% of the cycle period of the input clock signal CKIN, and the precision of the time intervals corresponding to 50%, 25% and 12.5% of the cycle period of the input clock signal CKIN can be guaranteed. As the present invention does not suffer issues such as device mismatch and offset, the problems of the related arts can be solved.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

In order to generate a doubled frequency that is twice the frequency of an original clock signal, the original clock signal may be performed an exclusive-OR operation with a delayed signal to generate a doubled clock signal having the doubled frequency, where the original clock signal is delayed by 25% of one cycle period of the original clock signal (referred to as "25% delay") for generating the 25% delayed signal. It is preferably to make a duty cycle of the doubled clock signal be equal to or substantially equal to 50% for spur-related requirements of a phase-locked loop (PLL), and at least two calibration operations are adopted. The delay applied to the original clock signal (i.e. the aforementioned 25% delay) needs to be calibrated, and a duty cycle of the original clock signal needs to be calibrated as well. The mechanism of generating a quadrupled frequency that is four times the frequency of the original clock signal is similar, where in addition to the 25% delay, a 12.5% delay needs to be further generated and calibrated. Thus, the present invention aims at providing embodiments of duty cycle calibration, and more particularly, calibration of the aforementioned 2.5% delay and/or 12.5% delay.

Figure 1:
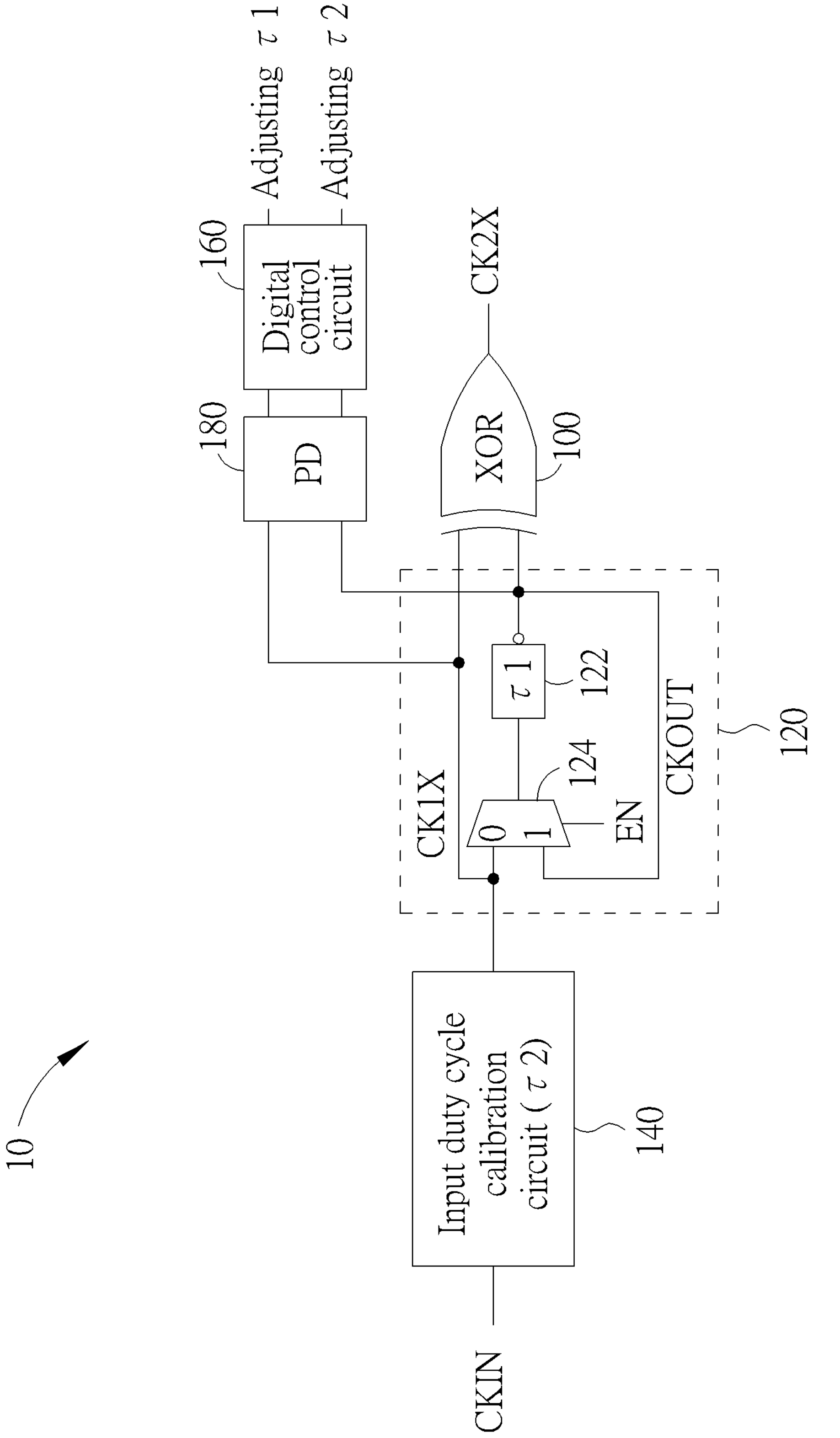
FIG. 1 is a simplified diagram illustrating a frequency doubler according to an embodiment of the present invention.

FIG. 1 is a simplified diagram illustrating a frequency multiplier such as a frequency doubler 10 according to an embodiment of the present invention, where the frequency doubler 10 may be applied in the PLL. As shown in FIG. 1, the frequency doubler 10 may comprise at least one XOR logic circuit such as an XOR logic circuit 100 (which is labeled "XOR" for brevity), a first calibration circuit such as a delay calibration circuit 120, a second calibration circuit such as an input duty cycle calibration circuit 140, and a controller such as a digital control circuit 160. The delay calibration circuit 120 may comprise a first delay cell 122 configured to provide a first delay τ1, where "τ1" is labeled on the first delay cell 122 for better comprehension. The delay calibration circuit 120 may further comprise a multiplexer 124 controlled by an enable signal EN, where the enable signal EN may be transmitted from a control circuit of the PLL or from the digital control circuit 160, but the present invention is not limited thereto. The input duty cycle calibration circuit 140 may be configured to generate an input calibration signal CK1X according to an input clock signal CKIN, e.g. the input duty cycle calibration circuit 140 may adjust a duty cycle of the input clock signal CKIN to generate the input calibration signal CK1X with aid of a second delay τ2 (which is labeled on the input duty cycle calibration circuit 140 for better comprehension).

For example, when the frequency doubler 10 operates in a calibration mode, the enable signal EN may be set to "1", and an output terminal of the first delay cell 122 is coupled to an input terminal of the delay cell by the multiplexer 124 (e.g. the first delay cell 122 and the multiplexer may form a ring-oscillator (RO)-type delay cell), and the first delay cell 122 is therefore repeatedly used multiple times (e.g. M times, where M may be a predetermined positive integer such as four) for delaying the input calibration signal CK1X or a derivative thereof (e.g. a derivative signal of the input calibration signal CK1X) by multiple times the first delay τ1 (e.g. delaying by M×τ1), to generate a delayed signal CKOUT or a derivative thereof (e.g. a derivative signal of the delayed signal CKOUT). In another example, when the frequency doubler 10 operates in a normal mode, the enable signal EN may be set to "0", and signal(s) on the output terminal of the first delay cell 122 will not be fed back to the input terminal of the delay cell 122, where the first delay cell 122 is therefore used one time only, for delaying the input calibration signal CK1X or the derivative thereof by the first delay τ1 to generate the delayed signal CKOUT, and the XOR logic circuit 100 may be configured to perform at least one XOR operation on the input calibration signal CK1X or the derivative thereof with a final delayed signal (e.g. the delayed signal CKOUT), to generate an output signal with a multiplied frequency such as a doubled clock signal CK2X.

In this embodiment, when the first delay cell 122 receives a rising edge, the first delay cell 122 will output a falling edge with the first delay τ1; and when the first delay cell 122 receives a falling edge, the first delay cell 122 will output a rising edge with the first delay τ1.

In this embodiment, the digital control circuit 160 may be coupled to the delay calibration circuit 120 and the input calibration circuit 140, for adjusting the first delay τ1 and the second delay τ2 (which are labeled "Adjusting τ1" and "Adjusting τ1" for brevity) in the calibration mode. For example, the first delay cell 122 can be repeatedly used M times (e.g. four times) for delaying the input calibration signal CK1X or the derivative thereof by M times the first delay τ1 (e.g. delaying by M×τ1), to generate a first delayed signal. and the digital control circuit 160 may control the first delay τ1 (e.g. adjusting τ1) according to the first delayed signal, to find a target delay which makes M times the target delay be equal to one cycle period of the input clock signal CKIN. That is, the target delay may be equal to 1/M times the cycle period of the input clock signal CKIN, which may be an example of the aforementioned 25% delay. After the target delay is found, the first delay cell 122 can be repeatedly used M/2 times (e.g. two times) for delaying the input calibration signal CK1X or the derivative thereof by M/2 times the target delay (which may be equal to 50% of the cycle period of the input clock signal CKIN), to generate a second delayed signal. The digital control circuit 160 can control the input duty cycle calibration circuit 140 according to the second delayed signal to make the input calibration signal CK1X have a target duty cycle such as 50%, e.g. the second delayed signal carries information related to a time interval corresponding to a precise 50% duty cycle, which may be utilized as a reference for calibrating the duty cycle of the input calibration signal CK1X.

In this embodiment, the frequency doubler 10 may further comprise a phase detector 180 (which is labeled "PD" for brevity) coupled to the digital control circuit 160. In detail, when calibrating the first delay τ1, the phase detector 180 may detect a phase difference between a delayed edge of the first delayed signal and a target edge of the input calibration signal CK1X, and the digital control circuit 160 may control the first delay τ1 to make the delayed edge of the first delayed signal be aligned with the target edge of the input calibration signal CK1X. For example, the delayed edge of the first delayed signal may be generated by delaying a first edge of the input calibration signal CK1X or the derivative thereof, and the target edge of the input calibration signal CK1X may be a second edge that is one cycle period later than the first edge. That is, when the delayed edge of the first delayed signal is aligned with the target edge of the input calibration signal CK1X, M×τ1 may be equal to one cycle period of the input clock signal CKIN (or the input calibration signal CK1X), and the target delay which is equal to 1/M times the cycle period of the input clock signal CKIN is therefore obtained. After the target delay is found, the phase detector 180 may generate another phase difference based on the second delayed signal and the input calibration signal CK1X, and calibrate the duty cycle of the input calibration signal CK1X according to this phase difference.

Figure 2:
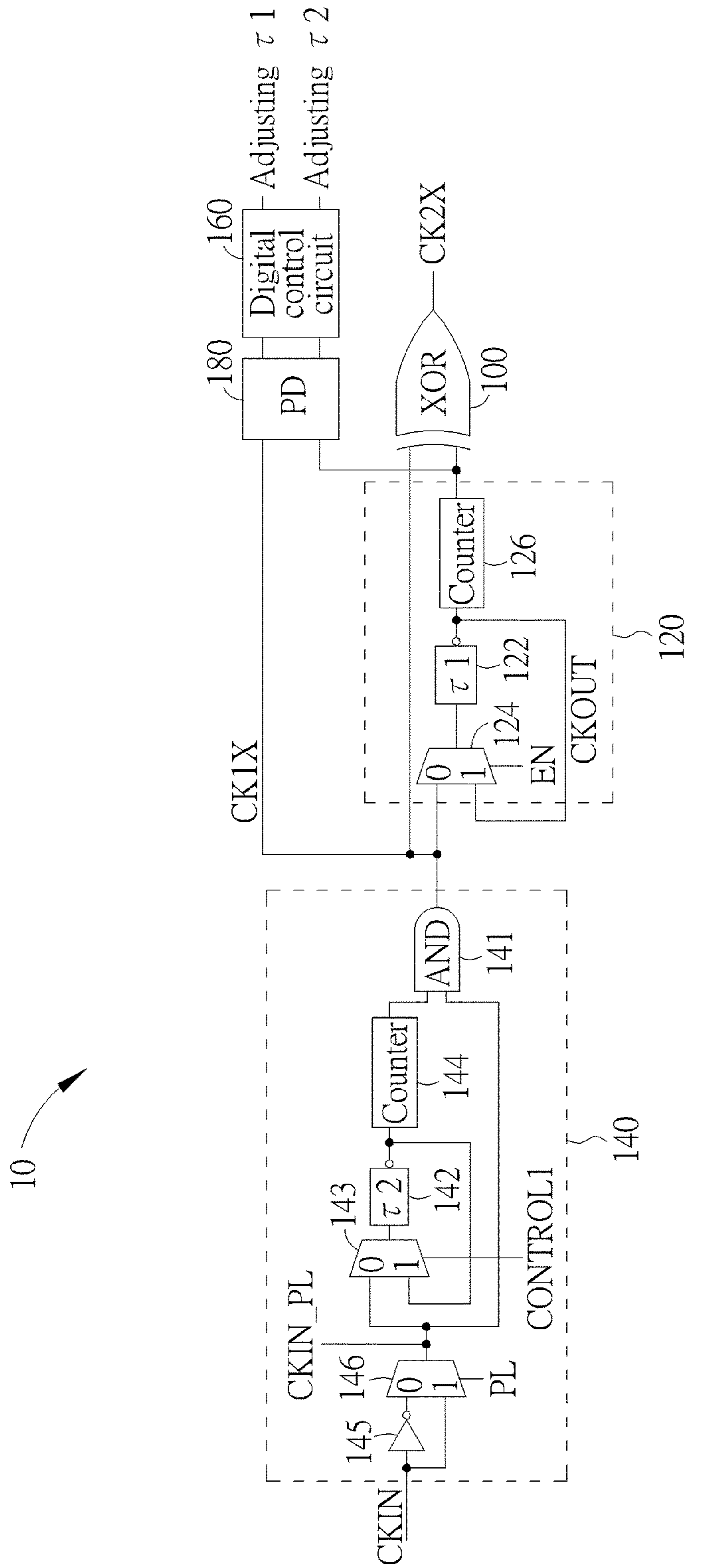
FIG. 2 is a diagram illustrating a detailed circuit diagram of the frequency doubler shown in FIG. 1 according to an embodiment of the present invention.

FIG. 2 is a diagram illustrating a detailed circuit diagram of the frequency doubler 10 shown in FIG. 1 according to an embodiment of the present invention, where the delay calibration circuit 120 may further comprise a counter 126 coupled to the output terminal of the first delay cell 122. In the phase of calibrating the first delay τ1, the counter 126 may generate edges of the first delayed signal (e.g. the delayed edge of the first delayed signal) when the first delay cell 122 has been repeatedly used M times. For example, the counter 126 may receive a transition edge of the delayed signal CKOUT from the first delay cell 122 every time interval of the first delay τ1, and when the counter 126 receives the $M^{th}$ transition edge of the delayed signal CKOUT from the first delay cell 122 (which means a duration of M×τ1 elapses), the counter 126 may output the delayed edge of the first delayed signal (e.g. an output signal of the counter 126 which may be regarded as the derivative of the delayed signal CKOUT) to the phase detector 180. In the phase of calibrating the second delay τ2, the counter 126 may generate edges of the second delayed signal when the first delay cell 122 has been repeatedly used M/2 times (e.g. when the counter 126 receives the $(M/2)^t$ transition edge from the first delay cell 122, which means a duration of M/2×τ1 elapses).

As shown in FIG. 2, the input duty cycle calibration circuit 140 may comprise an AND logic circuit 141 (which is labeled "AND" for brevity) and a second delay cell, where the second delay cell may be configured to provide the second delay τ2, and the digital control circuit 160 may control the second delay τ2 according to the second delayed signal to make the input calibration signal CK1X have the target duty cycle. In this embodiment, the second delay cell may comprise a unit delay element 142 (which is labeled "τ2" for better comprehension), a multiplexer 143 and a counter 144, where the unit delay element 142 is configured to provide a unit delay, and the multiplexer 143 is controlled by a control signal CONTROL1. In addition, the input duty cycle calibration circuit 140 may further comprise an inverter 145 and a multiplexer 146 coupled to the second delay cell, where the inverter 145 is configured to generate an inverted clock signal according to the input clock signal CKIN, and the multiplexer is configured to select one of the input clock signal CKIN and the inverted clock signal according to a comparison between a current duty cycle of the input clock signal CKIN and the target duty cycle for being sent to the second delay cell. For example, the multiplexer 146 may select one of the input clock signal CKIN and the inverted clock signal as a selected clock signal CKIN_PL for being transmitted to the second delay cell according to a polarity signal PL, where the polarity signal PL may represent the aforementioned comparison, which may indicate whether the current duty cycle of the input clock signal CKIN is greater than the target duty cycle. In particular, when the current duty cycle is greater than the target duty cycle, the polarity signal PL is "1", and the multiplexer 146 may select the input clock signal CKIN to be delayed by the second delay cell for usage of calibrating the input calibration signal CK1X; and when the current duty cycle is less than the target duty cycle, the polarity signal PL is "0", and the multiplexer 146 may select the inverted clock signal to be delayed by the second delay cell for usage of calibrating the input calibration signal CK1X. Furthermore, the AND logic circuit 142 may perform an AND logic operation on the selected signal and a delayed signal output from the second delay cell, where the second delay cell delays the selected signal by the second delay τ2 for generating this delayed signal.

In detail, when a transition edge of the selected clock signal CKIN_PL is detected (e.g. detected by the digital control circuit 160 or the control circuit of the PLL), the control signal CONTROL1 may be triggered and pulled from low to high (e.g. from a logic value "0" to a logic value "1"), and an output terminal of the unit delay element 142 may be coupled to an input terminal of the unit delay element 142, thereby forming an RO-type delay cell for generating the second delay τ2. For example, the unit delay element 142 may be repeatedly used N1 times for making the second delay τ2 be equal to N1 times the unit delay, where the counter 144 is configured to output the signal delayed by the second delay cell. Operations of the counter 144 may be deduced by analogy based on the operation of the counter 126, and related details are omitted here for brevity. In this embodiment, N1 may be a positive integer corresponding to a digital code controlled by the digital control circuit 160, and the digital control circuit 160 can control the second delay τ2 by controlling this digital code and thereby controlling how many times the unit delay element 142 is repeatedly used. It should be noted that labeling "τ2" on the unit delay element 142 is for illustrative purposes only, but the second delay τ2 is actually generated by repeatedly using the unit delay element 142 (e.g. τ2 is equal to N1 times the unit delay provided by the unit delay element 142).

In this embodiment, when the unit delay element 142 receives a rising edge, the unit delay element 142 will output a falling edge with the unit delay; and when the unit delay element 142 receives a falling edge, the unit delay element 142 will output a rising edge with the unit delay.

Figure 3:
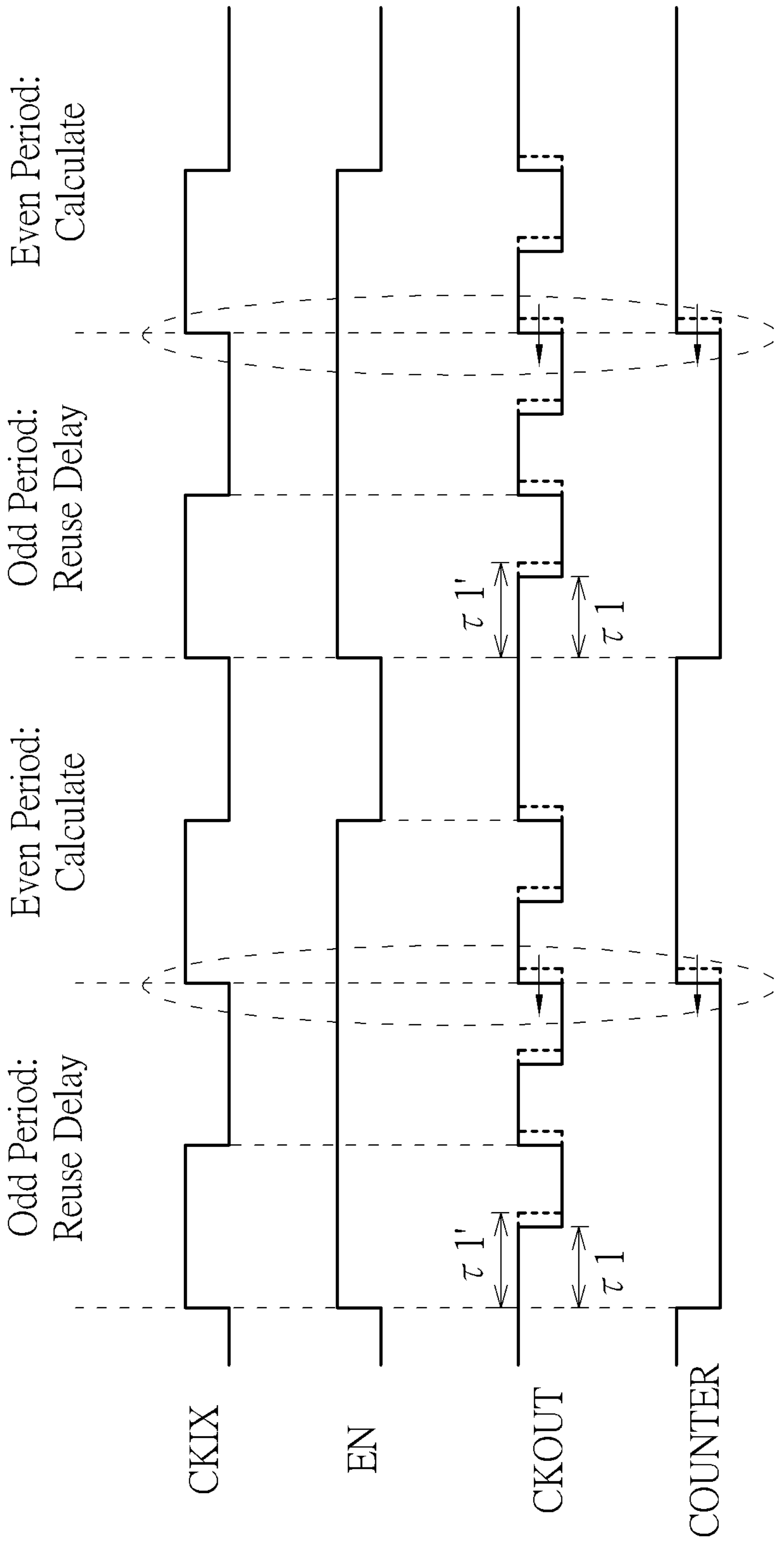
FIG. 3 is a timing diagram illustrating some signals during a phase of calibrating a first delay according to an embodiment of the present invention.

FIG. 3 is a timing diagram illustrating some signals (e.g. the input calibration signal CK1X, the enable signal EN, the delayed signal CKOUT and an output signal of the counter 126 shown in FIG. 2) during the phase of calibrating the first delay τ1 according to an embodiment of the present invention, where the output signal of the counter 126 is illustrated by a counter output signal COUNTER in FIG. 3. As shown in FIG. 3, in odd periods of the input calibration signal CK1X, operations of reusing the first delay τ1 are performed, which are labeled "Odd period: Reuse Delay"; and in even periods of the input calibration signal CK1X, operation of calculating the adjustment of the first delay τ1 are performed, which are labeled "Even period: Calculate". In this embodiment, at the beginning of the odd periods of the input calibration signal CK1X (e.g. when a first rising edge of the input calibration signal CK1X is received), the enable signal EN may be triggered and pulled to high, and the operation of repeatedly using the first delay cell 122 begins. When the first delay cell 122 has been repeatedly used four times and a rising edge of the counter output signal COUNTER is therefore generated as illustrated by the portions being circled in FIG. 3, a phase difference between a second rising edge of the input calibration signal CK1X and the rising edge of the counter output signal COUNTER can be detected. Assume that an original value of the first delay is τ1', and the detected phase difference indicates that four times the first delay τ1' is greater than one cycle period of the input calibration signal CK1X (or one cycle period of the input clock signal CKIN). The digital control circuit 160 may accordingly adjust (e.g. reduce) the first delay from τ1' to τ1 to make the rising edge of the counter output signal COUNTER be aligned with the rising edge of the input calibration signal CK1X as shown in FIG. 3.

Figure 4:
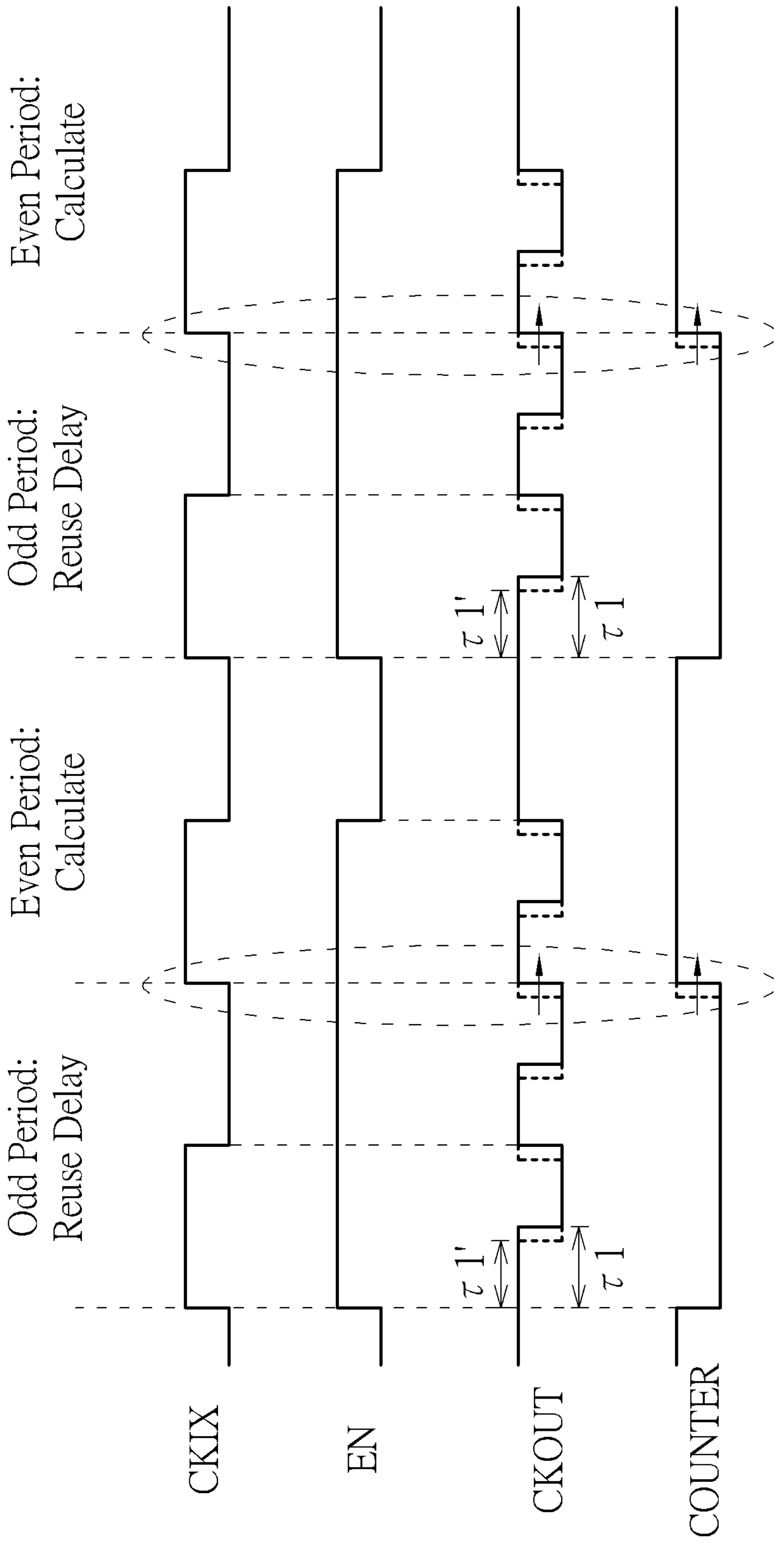
FIG. 4 is a timing diagram illustrating some signals during a phase of calibrating a first delay according to another embodiment of the present invention.

In another embodiment, assume that the detected phase difference indicates that four times the first delay τ1' is less than one cycle period of the input calibration signal CK1X (or one cycle period of the input clock signal CKIN) as shown in FIG. 4. The digital control circuit 160 may accordingly adjust (e.g. increase) the first delay from τ1' to τ1 to make the rising edge of the counter output signal COUNTER be aligned with the rising edge of the input calibration signal CK1X as illustrated by the portions being circled in FIG. 4.

Figure 5:
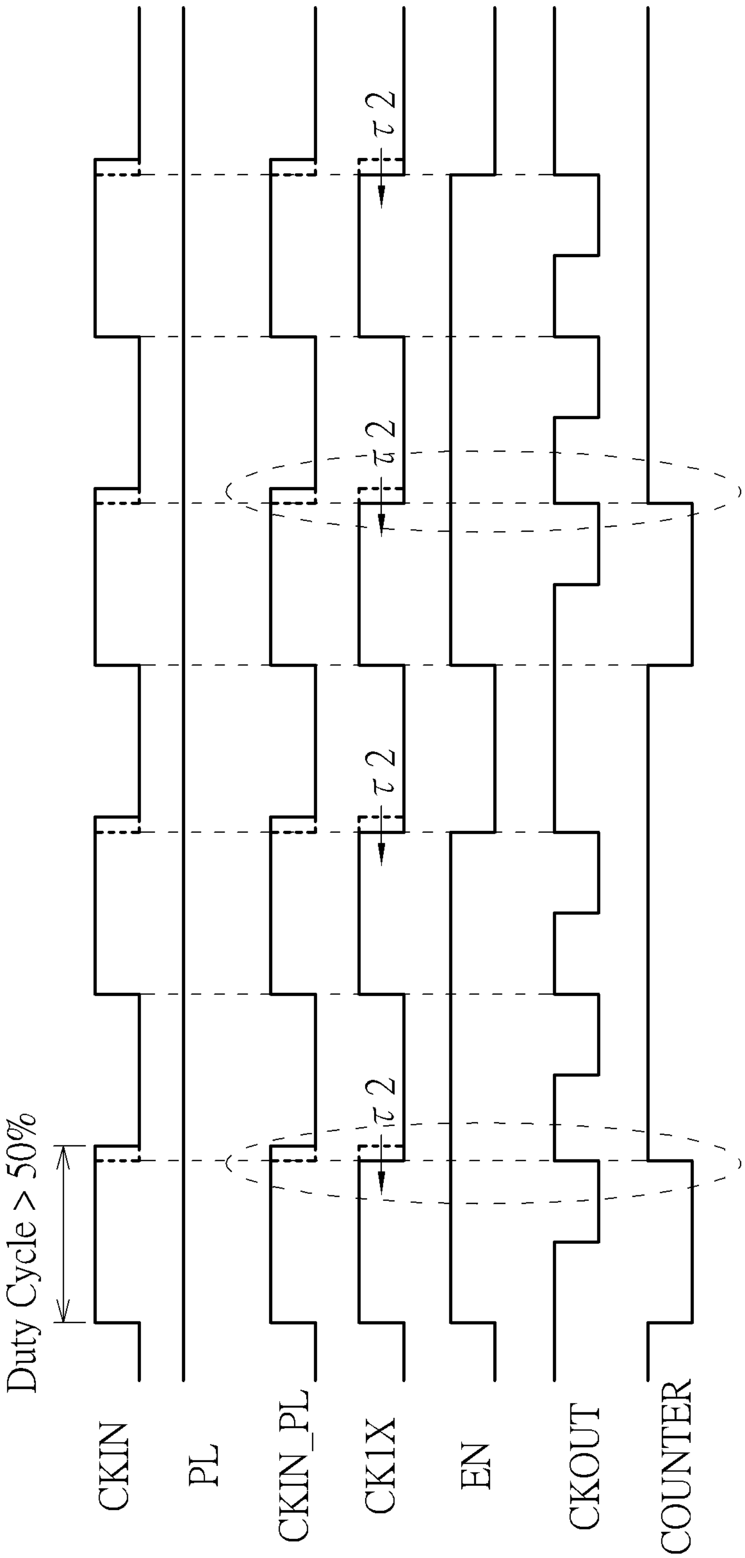
FIG. 5 is a timing diagram illustrating some signals during a phase of calibrating a second delay according to an embodiment of the present invention.

FIG. 5 is a timing diagram illustrating some signals (e.g. the input clock signal CKIN, the polarity signal PL, the selected signal CKIN_PL, the input calibration signal CK1X, the enable signal EN, the delayed signal CKOUT and the output signal of the counter 126 shown in FIG. 2) during the phase of calibrating the second delay τ2 according to an embodiment of the present invention, where the output signal of the counter 126 is illustrated by a counter output signal COUNTER in FIG. 5. As shown in FIG. 5, the counter 126 may generate a rising edge of the counter output signal COUNTER when the first delay cell 126 has been repeatedly used two times, and this rising edge can be utilized as a reference edge for calibrating the duty cycle of the input calibration signal CK1X. Assuming that the duty cycle of the input clock signal CKIN is greater than the target duty cycle (e.g. the duty cycle of the input clock signal CKIN is 53% which is greater than 50%), the polarity signal PL is set to "1", and the input clock signal CKIN is selected as illustrated by the selected signal CKIN_PL. The input duty cycle calibration circuit 140 may reduce the interval of the input calibration signal CK1X being "1" by τ2, to reduce the duty cycle of the input calibration signal CK1X. More particularly, the digital control circuit 160 may adjust the second delay τ2 to make a falling edge of the input calibration signal CK1X be aligned with the reference edge, as illustrated by the portions being circled in FIG. 5.

Figure 6:
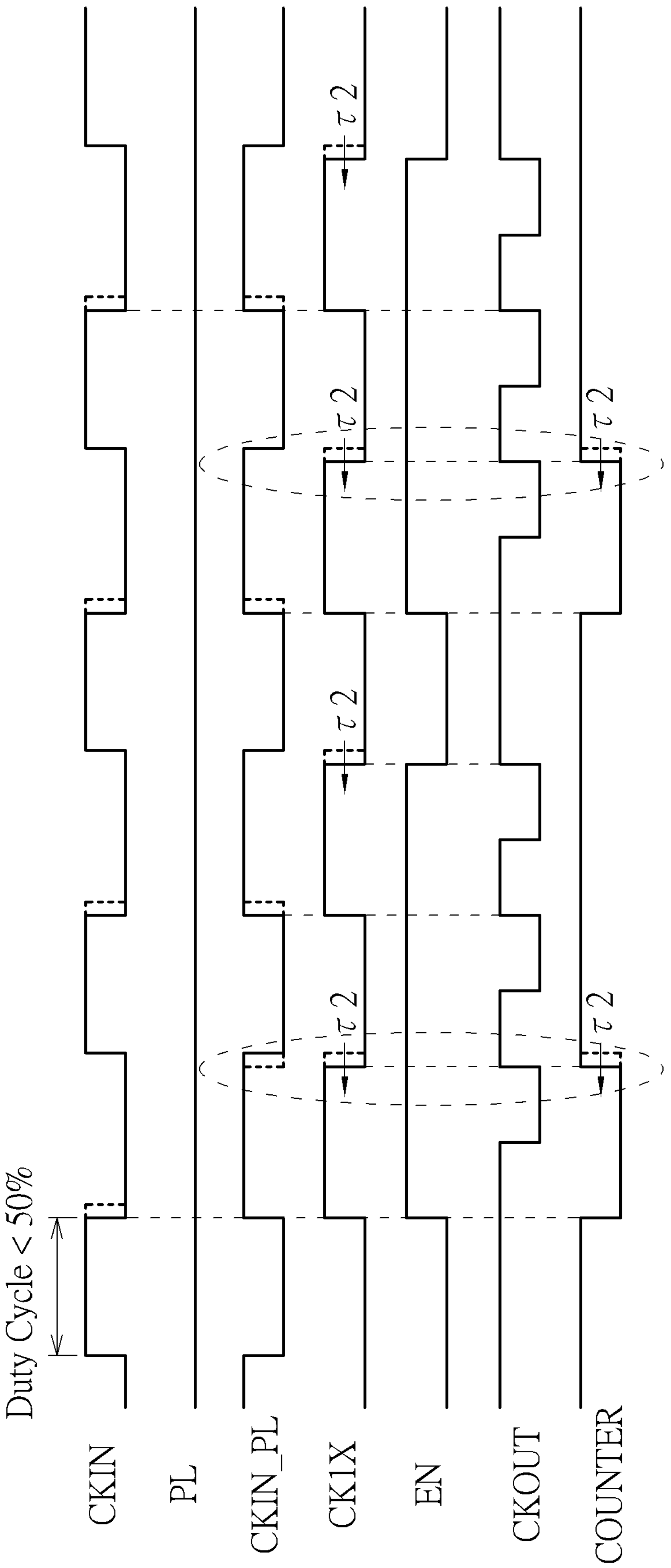
FIG. 6 is a timing diagram illustrating some signals during a phase of calibrating a second delay according to another embodiment of the present invention.

In another embodiment, assuming that the duty cycle of the input clock signal CKIN is less than the target duty cycle (e.g. the duty cycle of the input clock signal CKIN is 47% which is less than 50%), the polarity signal PL is set to "0", and the inverted clock signal generated according to the input clock signal CKIN is selected as illustrated by the selected signal CKIN_PL, so the duty cycle of the CKIN_PL may be greater than the target duty cycle (e.g. the duty cycle of the CKIN_PL is 53% which is greater than 50%) as shown in FIG. 6. The input duty cycle calibration circuit 140 may reduce the interval of the input calibration signal CK1X being "1" by τ2, to reduce the duty cycle of the input calibration signal CK1X. More particularly, the digital control circuit 160 may adjust the second delay τ2 to make the falling edge of the input calibration signal CK1X be aligned with the reference edge, as illustrated by the portions being circled in FIG. 6.

Figure 7:
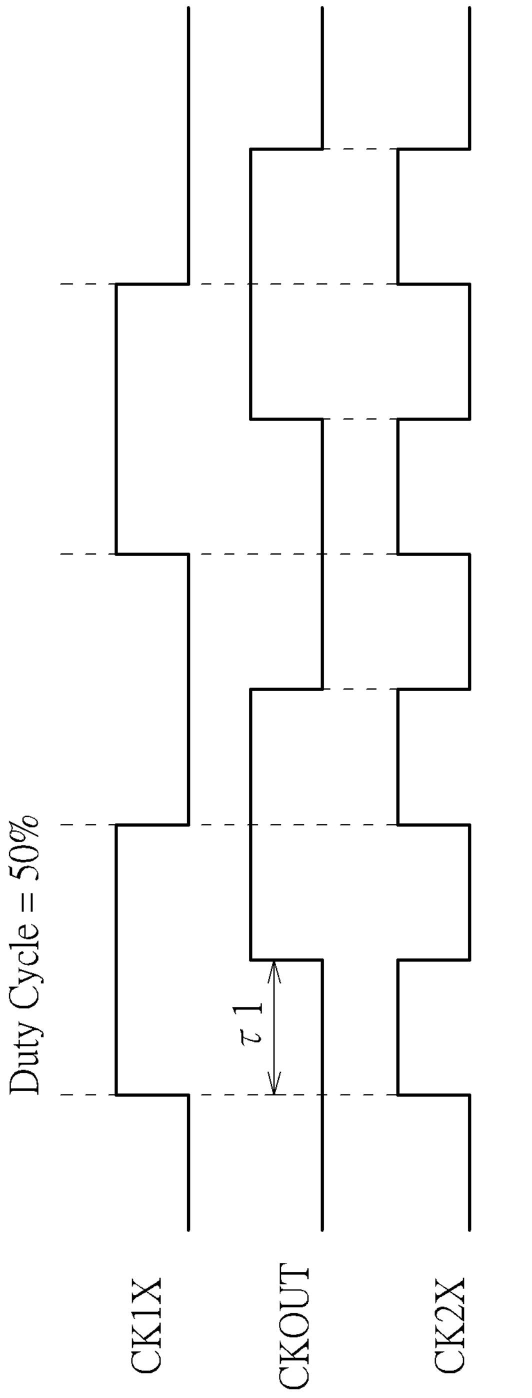
FIG. 7 is a timing diagram illustrating some signals after calibration is completed according to an embodiment of the present invention.

After the calibration regarding the first delay τ1 and the second delay τ2 is completed, the duty cycle of the input calibration signal CK1X can be equal to or substantially equal to 50%, and the first delay τ1 can be equal to or substantially equal to 25% of one cycle period of the input clock signal CKIN (or the input calibration signal CK1X) as shown in FIG. 7. Based on this calibration result, the XOR logic circuit 100 may generate the doubled clock signal CK2X by performing the XOR operation on the input calibration signal CK1X and the delayed signal CKOUT, where the duty cycle of the double clock signal can be equal to or substantially equal to 50%.

Figure 8:
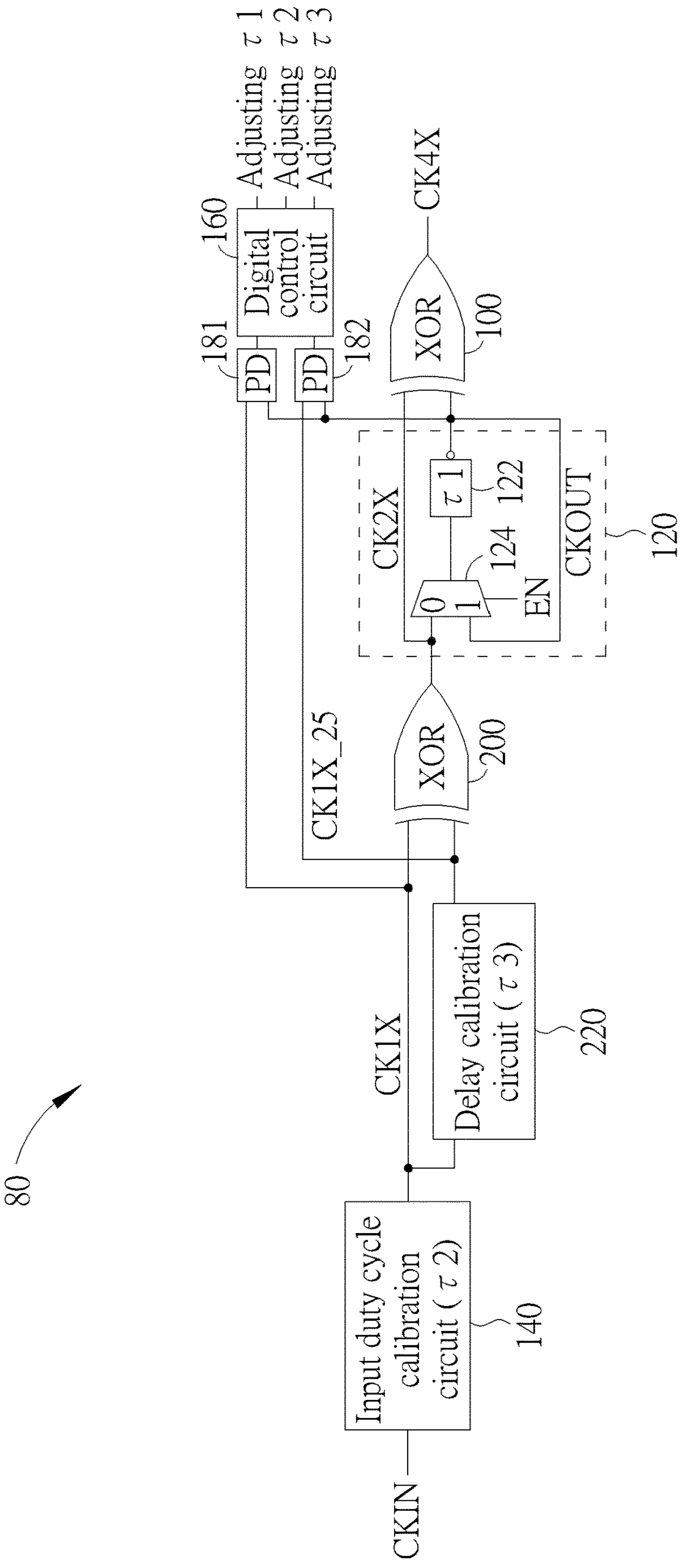
FIG. 8 is a simplified diagram illustrating a frequency quadrupler according to an embodiment of the present invention.

FIG. 8 is a simplified diagram illustrating a frequency multiplier such as a frequency quadrupler 80 according to an embodiment of the present invention, where the frequency quadrupler 80 may be obtained by amending the frequency doubler 10 shown in FIG. 1. The frequency quadrupler 80 may be applied in the PLL. In addition to the XOR logic circuit 100, the delay calibration circuit 120, the input duty cycle calibration circuit 140 and the digital control circuit 160, the frequency quadrupler 80 may further comprise a XOR logic circuit 200, a third calibration circuit such as a delay calibration circuit 220, and phase detectors 181/182. In this embodiment, the delay calibration 220 may be configured to delay the input calibration signal CK1X by a third delay τ3 for generating a delayed signal CK1X_25, where "τ3" is labeled on the delay calibration circuit 220 for better comprehension. The XOR logic circuit 200 may perform an XOR operation on the input calibration CK1X and the delayed signal CK1X_25 to generate a doubled clock signal CK2X, where the doubled clock signal CK2X may be an example of the derivative of the input calibration signal CK1X.

In this embodiment, the operation of calibrating the first delay τ1 may be performed by repeatedly using the first delay cell 122 M times (e.g. eight times) for delaying the doubled clock signal CK2X by M times the first delay $\tau 1$ (e.g. $8\times\tau 1$) to generate the delayed signal CKOUT or the derivative thereof. The phase detector 181 may detect a phase difference between a delayed edge of the delayed signal CKOUT or the derivative thereof, and the digital control circuit 160 may control the first delay $\tau 1$ (e.g. adjusting $\tau 1$) according to this phase difference. After the calibration of the first delay $\tau 1$ is completed (e.g. the target delay of the first delay cell 122 is found), the first delay cell 122 may be repeatedly used M/2 times (e.g. four times) for delaying the doubled clock signal CK2X by M/2 times the first delay $\tau 1$ (e.g. $4\times\tau 1$), in order to provide a reference edge for calibrating the duty cycle of the input calibration signal CK1X (more particularly, for calibrating/adjusting the second delay $\tau 2$), and the first delay cell 122 may be repeatedly used M/4 times (e.g. two times) for delaying the doubled clock signal CK2X by M/4 times the first delay $\tau 1$ (e.g. $2\times\tau 1$), in order to generate a third delayed signal and provide a reference edge of the third delayed signal for calibrating/adjusting the third delay $\tau 3$ (e.g. calibrating the delayed signal CK1X_25) with aid of the phase detector 182. For example, the digital control circuit 160 may control the delay calibration circuit 220 according to the third delayed signal, to make the third delay $\tau 3$ be equal to M/4 times the target delay (e.g. $2\times\tau 1$).

After the calibration of the first delay $\tau 1$, the second delay $\tau 2$ and the third delay $\tau 3$ are completed, the first delay cell 122 may be repeatedly used M/8 times (e.g. one time) to generate a final delayed signal such as the delayed signal CKOUT or the derivative thereof in a normal mode of the frequency quadrupler 80, and the XOR logic circuit 100 may perform an XOR operation on the doubled clock signal CK2X and this final delayed signal (e.g. the delayed signal CKOUT or the derivative thereof) to generate a quadrupled clock signal CK4X. As the calibration of the first delay $\tau 1$ and the second delay $\tau 2$ is similar to the aforementioned embodiments, and the calibration of the third delay $\tau 3$ may be deduced by analogy based on the calibration of the first delay $\tau 1$ and the second delay $\tau 2$, related details are omitted here for brevity.

Figure 9:
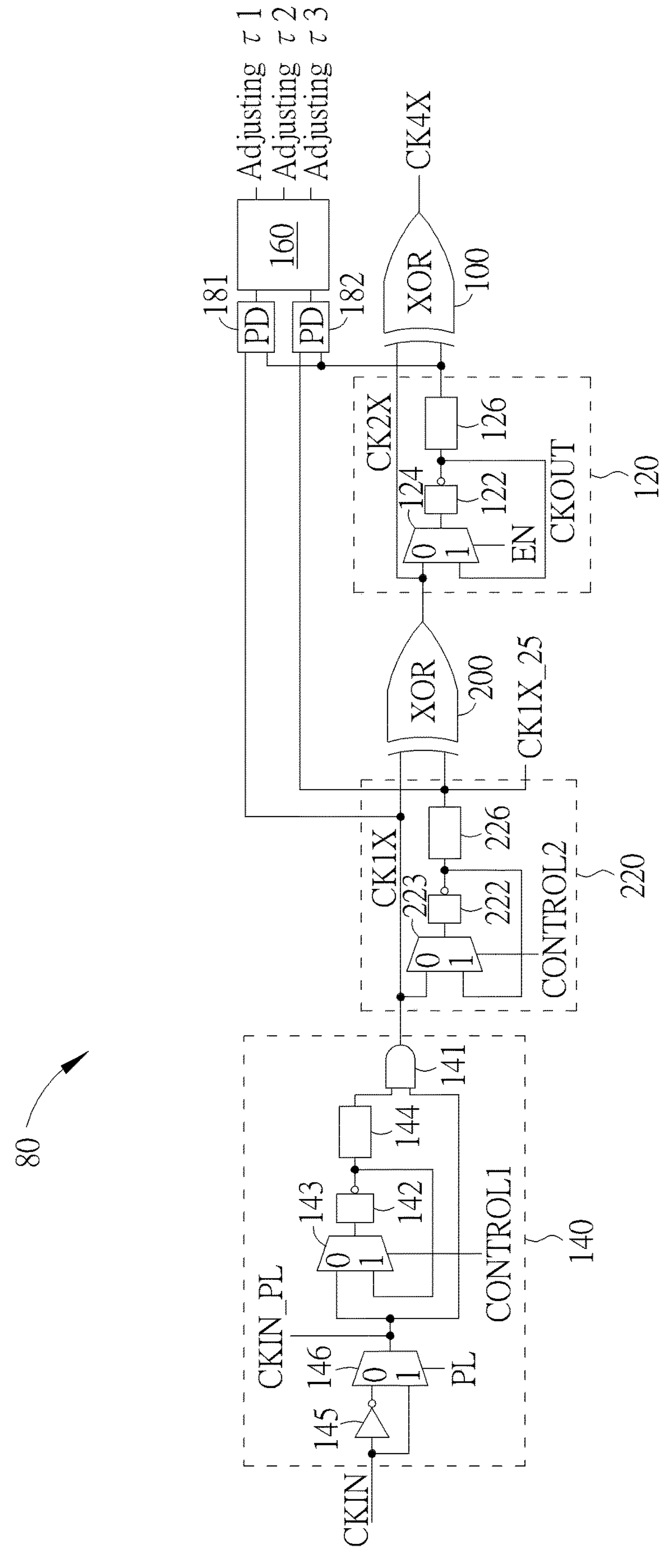
FIG. 9 is a diagram illustrating a detailed circuit diagram of the frequency quadrupler shown in FIG. 8 according to an embodiment of the present invention.

FIG. 9 is a diagram illustrating a detailed circuit diagram of the frequency quadrupler 80 shown in FIG. 8 according to an embodiment of the present invention, where the implementations of the delay calibration circuit 120 and the input duty cycle calibration circuit 140 are the same as the embodiment of FIG. 2, and related details are omitted here for brevity. Note that the multiplexer 143 is controlled by a control signal CONTROL1 in this embodiment. Furthermore, the delay calibration circuit 220 may comprise a third delay configured to provide the third delay $\tau 3$. Similar to the second delay cell within the input duty cycle calibration circuit 140, the third delay cell may comprise a unit delay element 222, a multiplexer 223 and a counter 224, where the unit delay element 222 is configured to provide a unit delay, and the multiplexer 223 is controlled by a control signal CONTROL2. In one embodiment, the unit delay provided by the unit delay element 222 may be the same as that provided by the unit delay element 142. In other embodiment, the unit delay provided by the unit delay element 222 may be different from that provided by the unit delay element 142.

In detail, when a transition edge of the input calibration signal CK1X is detected (e.g. detected by the digital control circuit 160 or the control circuit of the PLL), the control signal CONTROL2 may be triggered and pulled from low to high (e.g. from the logic value "0" to the logic value "1"), and an output terminal of the unit delay element 222 may be coupled to an input terminal of the unit delay element 222, thereby forming an RO-type delay cell for generating the third delay $\tau 3$. For example, the unit delay element 222 may be repeatedly used N2 times for making the third delay $\tau 3$ be equal to N2 times the unit delay, where the counter 224 is configured to output the delayed signal CK1X_25 delayed by the third delay cell. Operations of the counter 224 may be deduced by analogy based on the operation of the counters 126 and 144, and related details are omitted here for brevity. In this embodiment, N2 may be a positive integer corresponding to a digital code controlled by the digital control circuit 160, and the digital control circuit 160 can control the third delay $\tau 3$ by controlling this digital code and thereby controlling how many times the unit delay element 222 is repeatedly used.

In this embodiment, when the unit delay element 222 receives a rising edge, the unit delay element 222 will output a falling edge with the unit delay; and when the unit delay element 222 receives a falling edge, the unit delay element 222 will output a rising edge with the unit delay.

Figure 10:
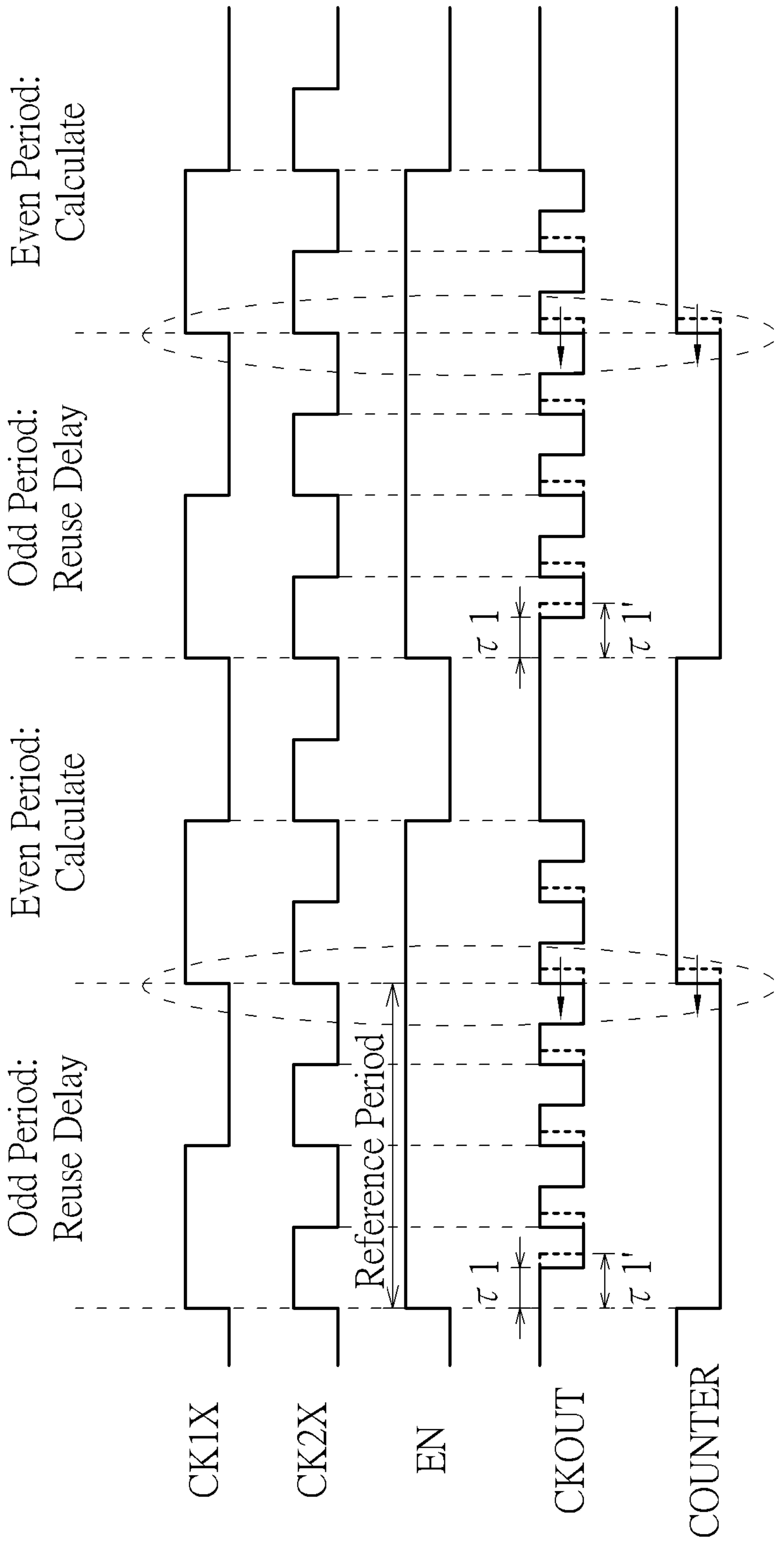
FIG. 10 is a timing diagram illustrating some signals during a phase of calibrating a first delay according to an embodiment of the present invention.

FIG. 10 is a timing diagram illustrating some signals (e.g. the input calibration signal CK1X, the doubled clock signal CK2X, the enable signal EN, the delayed signal CKOUT and the output signal of the counter 126 shown in FIG. 9) during the phase of calibrating the first delay $\tau 1$ according to an embodiment of the present invention, where the output signal of the counter 126 is illustrated by a counter output signal COUNTER in FIG. 10. In this embodiment, at the beginning of the odd periods of the input calibration signal CK1X (more particularly, when a first rising edge of the input calibration signal CK1X is received), the enable signal EN may be triggered by a rising edge of the doubled clock signal CK2X and pulled to high, and the operation of repeatedly using the first delay cell 122 begins. When the first delay cell 122 has been repeatedly used eight times and a rising edge of the counter output signal COUNTER is therefore generated as illustrated by the portions being circled in FIG. 10, a phase difference between a second rising edge of the input calibration signal CK1X and the rising edge of the counter output signal COUNTER can be detected. The embodiment of FIG. 10 illustrates the condition of reducing the first delay $\tau 1$ for making $8\times\tau 1$ be equal to one cycle period (which is labeled "Reference Period") of the input calibration signal CK1X, and the condition of increasing the first delay $\tau 1$ for calibration may be deduced by analogy, which is therefore omitted here for brevity.

Figure 11:
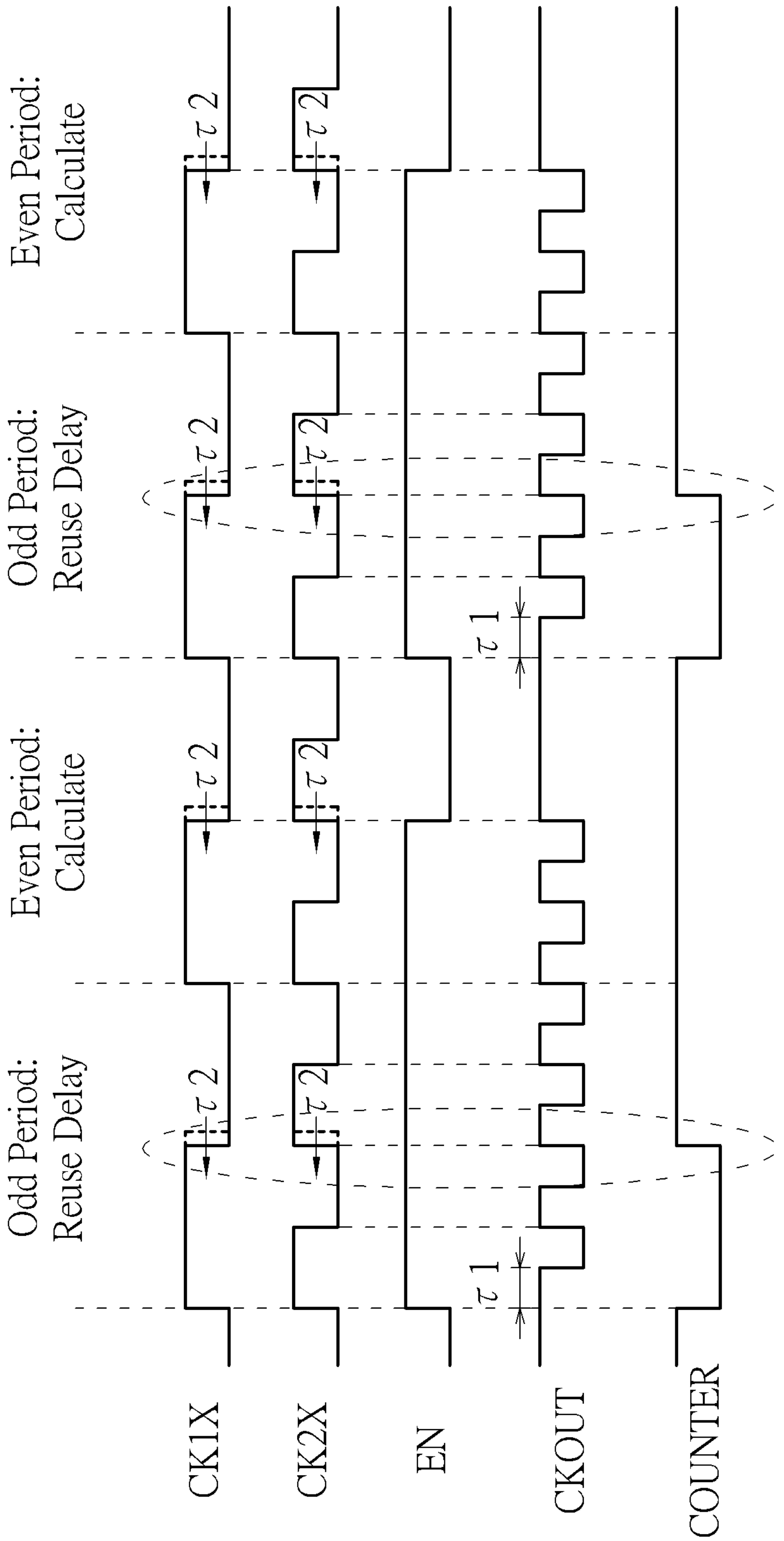
FIG. 11 is a timing diagram illustrating some signals during a phase of calibrating a second delay according to an embodiment of the present invention.

FIG. 11 is a timing diagram illustrating some signals (e.g. the input clock signal CKIN, the polarity signal PL, the selected signal CKIN_PL, the input calibration signal CK1X, the enable signal EN, the delayed signal CKOUT and the counter output signal COUNTER shown in FIG. 10) during the phase of calibrating the second delay $\tau 2$ according to an embodiment of the present invention. As shown in FIG. 11, the counter 126 may generate a rising edge of the counter output signal COUNTER when the first delay cell 126 has been repeatedly used four times, and this rising edge can be utilized as a reference edge for calibrating the duty cycle of the input calibration signal CK1X as illustrated by the portions being circled in FIG. 11. The operations of the inverter 145 and the multiplexer 146 in the frequency quadrupler 80 are the same as that in the frequency doubler 10, and are not repeated here for brevity.

Figure 12:
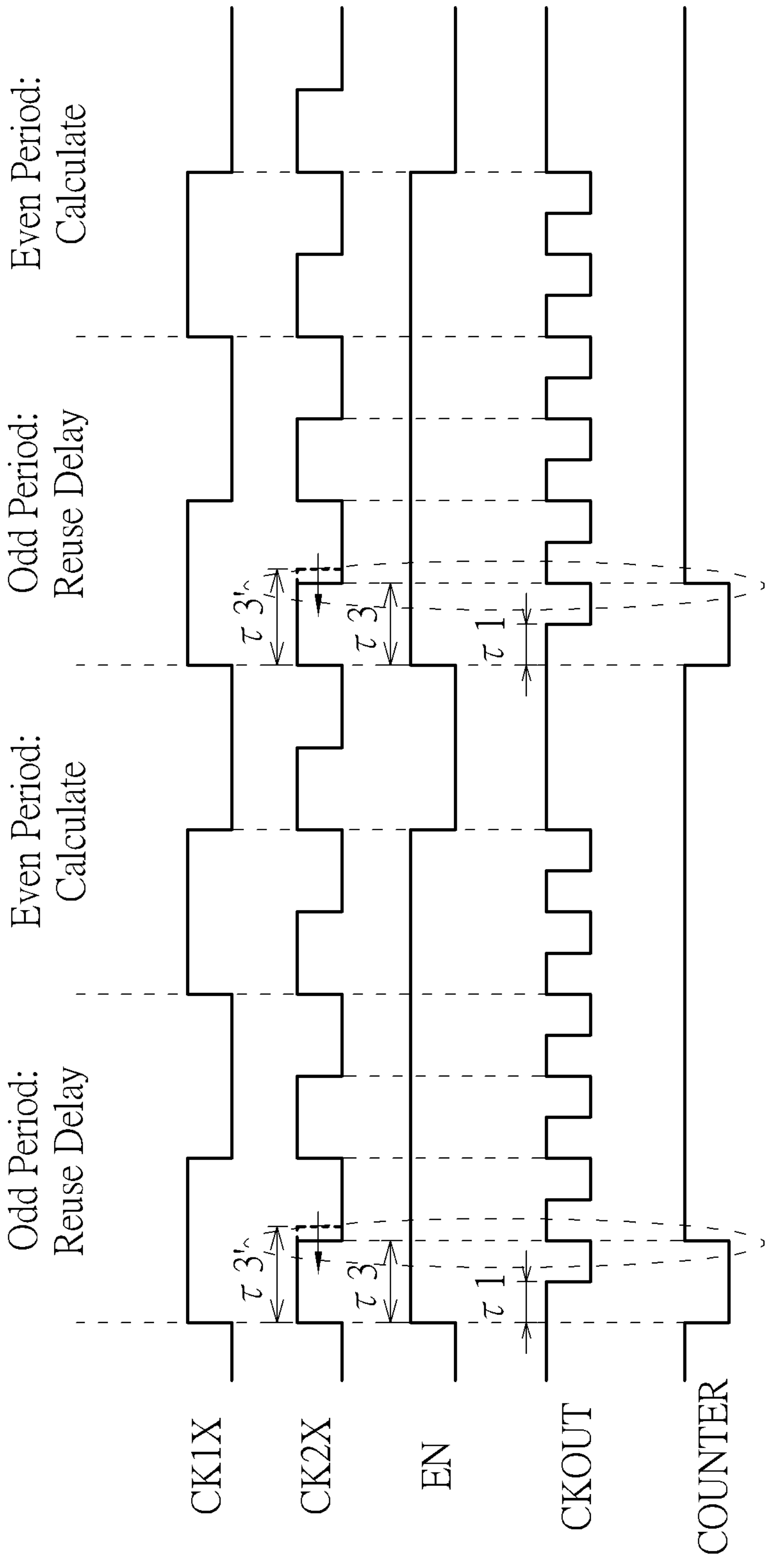
FIG. 12 is a timing diagram illustrating some signals during a phase of calibrating a third delay according to an embodiment of the present invention.

FIG. 12 is a timing diagram illustrating some signals (e.g. the input clock signal CKIN, the polarity signal PL, the selected signal CKIN_PL, the input calibration signal CK1X, the enable signal EN, the delayed signal CKOUT and the counter output signal COUNTER shown in FIG. 10)

during the phase of calibrating the second delay τ3 according to an embodiment of the present invention. As shown in FIG. 12, the counter 126 may generate a rising edge of the counter output signal COUNTER when the first delay cell 126 has been repeatedly used two times, and this rising edge can be utilized as a reference edge for calibrating the duty cycle of the input calibration signal CK2X as illustrated by the portions being circled in FIG. 12. In particular, the third delay τ3 can be calibrated to be equal to two times the first delay τ3, which is equal to 25% of one cycle period of the input calibration signal CK1X.

Figure 13:
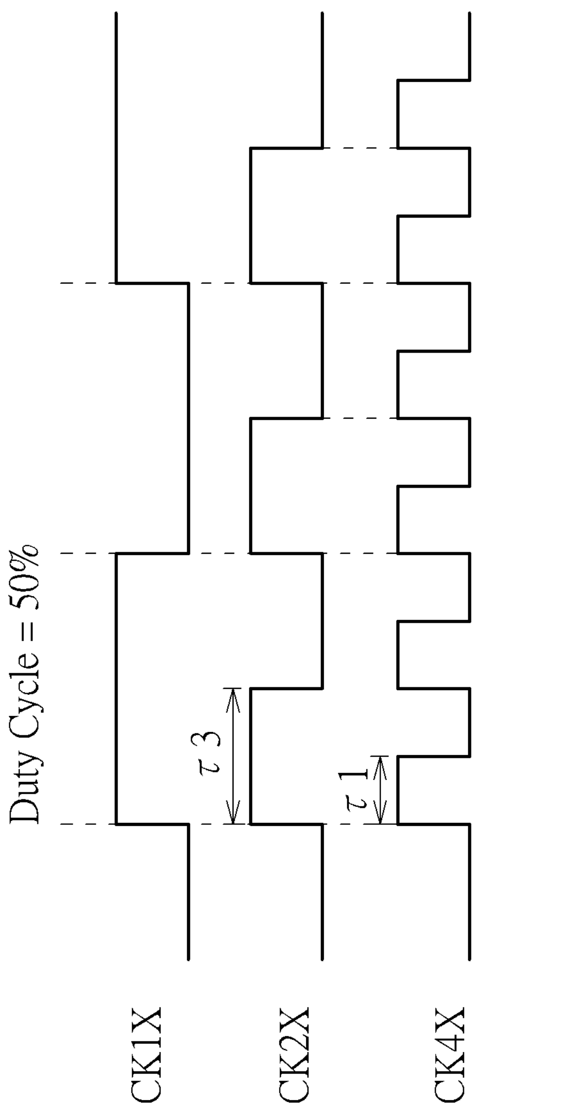
FIG. 13 is a timing diagram illustrating some signals after calibration is completed according to an embodiment of the present invention.

After the calibration regarding the first delay τ1, the second delay τ2 and the third delay τ3 is completed, the duty cycle of the input calibration signal CK1X can be equal to or substantially equal to 50%, the third delay τ3 (which corresponds to a duty cycle of the doubled clock signal CK2X) can be equal to or substantially equal to 25% of one cycle period of the input clock signal CKIN (or the input calibration signal CK1X), and the first delay τ1 (which correspond to a duty cycle of the quadrupled clock signal CK4X) can be equal to or substantially equal to 12.5% of one cycle period of the input clock signal CKIN (or the input calibration signal CK1X), as shown in FIG. 13. Based on this calibration result, the quadrupled clock signal CK4X generated by the XOR logic circuit 100 can be equal to or substantially equal to 50%.

Figure 14:
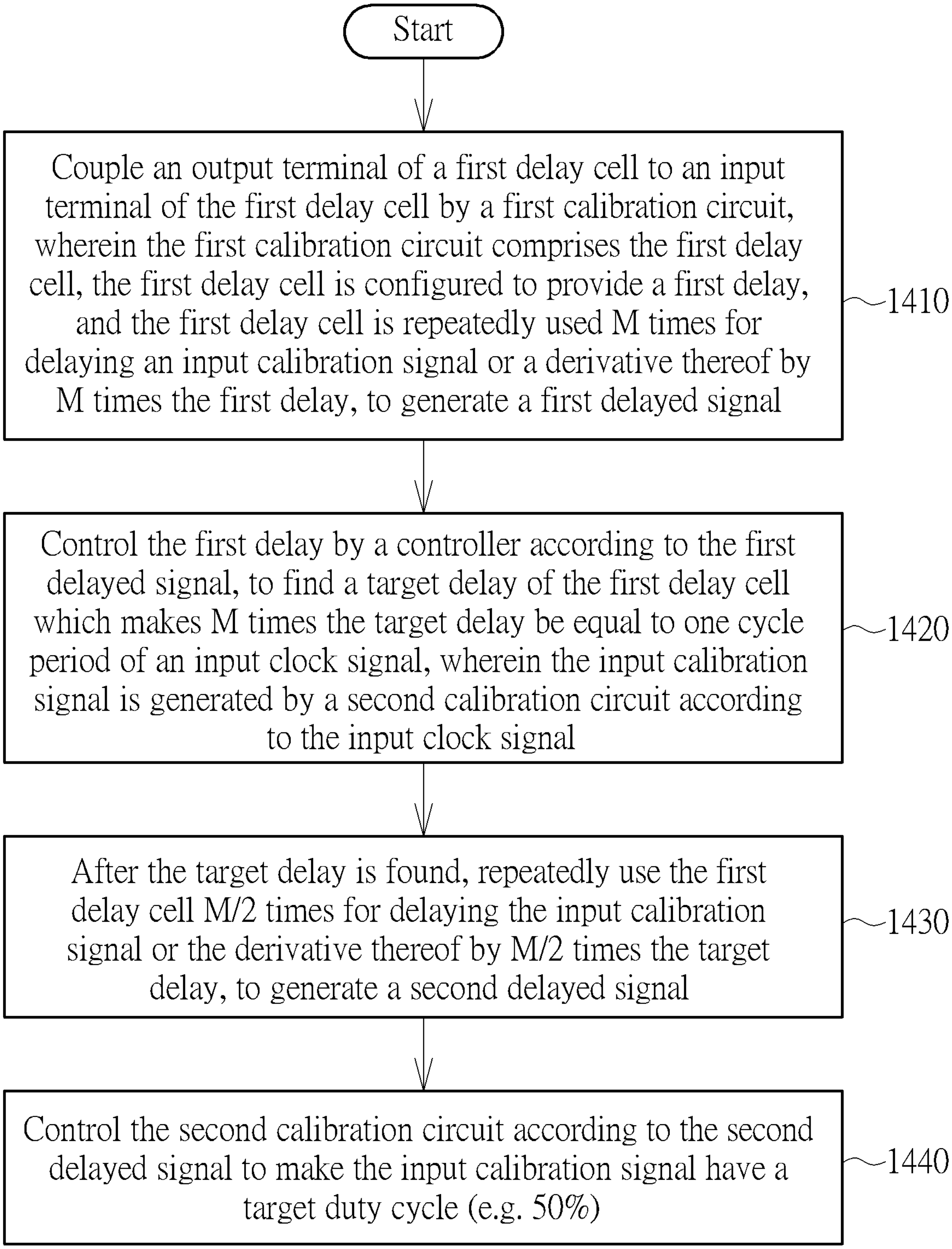
FIG. 14 is a working flow of a delay-reused duty cycle calibration method according to an embodiment of the present invention.

FIG. 14 is a working flow of a delay-reused duty cycle calibration method according to an embodiment of the present invention, where the delay-reused duty cycle calibration method may be applied to a frequency multiplier such as the frequency doubler 10 and the frequency quadrupler 80. It should be noted that the working flow shown in FIG. 14 is for illustrative purposes only, and is not meant to be a limitation of the present invention. One or more steps may be added, deleted or modified in the working flow shown in FIG. 14. In addition, if a same result may be obtained, these steps do not have to be executed in the exact order shown in FIG. 14.

In Step 1410, the frequency multiplier may couple an output terminal of a first delay cell (e.g. the first delay cell 122) to an input terminal of the first delay cell by a first calibration circuit (e.g. the delay calibration circuit 120), wherein the first calibration circuit comprises the first delay cell, the first delay cell is configured to provide a first delay (e.g. τ1), and the first delay cell is repeatedly used M times for delaying an input calibration signal (e.g. the input calibration signal CK1X) or a derivative thereof (e.g. the doubled clock signal CK2X) by M times the first delay, to generate a first delayed signal.

In Step 1420, the frequency multiplier may control the first delay by a controller (e.g. the digital control circuit 160) according to the first delayed signal, to find a target delay of the first delay cell which makes M times the target delay be equal to one cycle period of an input clock signal (e.g. the input clock signal CKIN), wherein the input calibration signal is generated by a second calibration circuit (e.g. the input duty cycle calibration circuit 140) according to the input clock signal.

In Step 1430, after the target delay is found, the frequency multiplier may repeatedly use the first delay cell M/2 times for delaying the input calibration signal or the derivative thereof by M/2 times the target delay, to generate a second delayed signal.

In Step 1440, the frequency multiplier may controls the second calibration circuit according to the second delayed signal to make the input calibration signal have a target duty cycle (e.g. 50%).

It should be noted that the order of calibrating the second delay τ2 and calibrating the third delay τ3 is not meant to be a limitation of the present invention. Once the operation of calibrating the first delay τ1 is completed (e.g. when the target delay of the first delay cell 122 is found), the order of calibrating the second delay τ2 and calibrating the third delay τ3 may vary.

It should be noted that the value of M is not meant to be a limitation of the present invention. More particularly, if the value of M is increased (referred to as higher reusing times), the first delay τ1 can be reduced since τ1 is expected to be 1/M times the cycle period of the input clock signal CKIN, and circuit area of the first delay cell can be reduced. The higher reusing times suffer lower resolution of adjusting τ1/τ2/τ3, however, and the spur-related performance of the PLL may therefore degrade. Thus, there is trade-off between the reusing time (which correspond to circuit area costs) and the resolution (which corresponds to the spur-related performance). An optimized value of M (e.g. 32) for the frequency doubler 10 may be obtained by simulation under certain spur-related requirement (e.g. <80 dBc), and an optimized value of M (e.g. 16) for the quadrupler 80 may be obtained by simulation under certain spur-related requirement (e.g. <80 dBc).

It is preferably to implement the counters 126, 144 and 224 by binary counters, and the value of M is preferably to be power of 2 (e.g. 4, 8, 16, 32, 64, 128 and so on), but the present invention is not limited thereto. Any multiples of four may be applied to the value of M in the frequency doubler 10, and any multiples of eight may be applied to the value of M in the frequency quadrupler 80. Note that certain values of M may result that the first delay τ1 is desired to be calibrated to a repeating decimal percentage of the cycle period of the input clock signal CKIN (e.g. when M=12 for the frequency doubler 10, the first delay τ1 is calibrated to a value around 8.3333% of the cycle period; and when M=24 for the frequency quadrupler 80, the first delay τ1 is calibrated to a value around 4.1667% of the cycle period). However, as long as the resolution of adjusting τ1/τ2/τ3 is small enough, the error introduced by the repeating decimal percentage will not be a dominant term of the overall quantization error of the calibration.

It is preferably to implement any (e.g. each) of the unit delay element 142 and the unit delay element 222 by a fixed delay element (e.g. an inverter with a fixed propagation delay), where the operation of adjusting the second delay τ2 may be performed by adjusting the reusing times (e.g. N1) of the unit delay element 142, and the operation of adjusting the second delay τ2 may be performed by adjusting the reusing times (e.g. N1) of the unit delay element 142, but the present invention is not limited thereto. In some embodiments, any of the second delay cell and the third delay cell may be implemented by analog circuits, and the operations of adjusting the second delay τ2 and/or the third delay τ3 may be performed in an analog manner (e.g. adjusting propagation loadings or driving strength in the second delay cell and/or the third delay cell). Similarly, the operation of adjusting the first delay τ1 provided by the first delay cell 122 is not limited to any specific mechanism, where the operation of adjusting the second delay τ2 and the third delay τ3 illustrated in the embodiments of FIG. 2 and FIG. 9 can be applied to the operation of adjusting the first delay τ1, but the present invention is not limited thereto. In some embodiment, the operation of adjusting the first delay τ1 may be performed in the analog manner mentioned above. As the first delay cell 122 is repeatedly used M times for obtaining a precise time interval corresponding to 1/M times the cycle period of the input clock signal CKIN, and is further repeatedly used M/2 times, M/4 times and M/8 times to generate precise time intervals corresponding to 50%, 25% and 12.5% of the cycle period of the input clock signal CKIN, adjusting the first delay $\tau 1$ in the analog manner will not suffer analog circuit related issues such as device mismatch or offset, and the precision of the time intervals corresponding to 50%, 25% and 12.5% of the cycle period of the input clock signal CKIN can be guaranteed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A frequency multiplier, comprising:

a first calibration circuit, comprising:

a first delay cell, configured to provide a first delay;

wherein in a calibration mode of the frequency multiplier, an output terminal of the first delay cell is coupled to an input terminal of the first delay cell, the first delay cell is repeatedly used M times for delaying an input calibration signal or a derivative thereof by M times the first delay, to generate a first delayed signal, and M is a predetermined positive integer;

a second calibration circuit, configured to generate the input calibration signal according to an input clock signal;

a controller, coupled to the first calibration circuit and the second calibration circuit, wherein the controller controls the first delay according to the first delayed signal, to find a target delay which makes M times the target delay be equal to one cycle period of an input clock signal; after the target delay is found, the first delay cell is repeatedly used M/2 times for delaying the input calibration signal or the derivative thereof by M/2 times the target delay, to generate a second delayed signal; and the controller controls the second calibration circuit according to the second delayed signal to make the input calibration signal have a target duty cycle; and a phase detector, coupled to the controller, configured to detect a phase difference between a delayed edge of the first delayed signal and a target edge of the input calibration signal;

wherein the controller controls the first delay to make the delayed edge of the first delayed signal be aligned with the target edge of the input calibration signal.

2. The frequency multiplier of claim 1, wherein in the calibration mode of the frequency multiplier, the output terminal of the first delay cell is coupled to the input terminal of the first delay cell to make a signal on the output terminal of the first delay cell be fed back to the input terminal of the first delay cell.

3. The frequency multiplier of claim 1, wherein the delayed edge of the first delayed signal is generated by delaying a first edge of the input calibration signal or the derivative thereof, and the target edge of the input calibration signal is a second edge that is one cycle period later than the first edge.

4. The frequency multiplier of claim 1, wherein the first calibration circuit further comprises:

a counter, coupled to the output terminal of the first delay cell, wherein the counter generates the delayed edge of the first delayed signal when the first delay cell has been repeatedly used M times.

5. The frequency multiplier of claim 1, wherein the second calibration circuit comprises:

a second delay cell, configured to provide a second delay;

wherein the controller controls the second delay according to the second delayed signal to make the input calibration signal have the target duty cycle.

6. The frequency multiplier of claim 5, wherein the second delay cell comprises:

a unit delay element, configured to provide a unit delay, wherein an output terminal of the unit delay element is coupled to an input terminal of the unit delay element;

wherein the unit delay element is repeatedly used N times for making the second delay be equal to N times the unit delay, and N is a positive integer corresponding to a digital code controlled by the controller.

7. The frequency multiplier of claim 5, where the second calibration circuit further comprises:

an inverter, configured to generate an inverted clock signal according to the input clock signal; and a multiplexer, coupled to second delay cell, configured to select one of the input clock signal and the inverted clock signal according to a comparison between a current duty cycle of the input clock signal and the target duty cycle for being sent to the second delay cell.

8. The frequency multiplier of claim 7, wherein:

when the current duty cycle is greater than the target duty cycle, the multiplexer selects the input clock signal to be delayed by the second delay cell for usage of calibrating the input calibration signal; and when the current duty cycle is less than the target duty cycle, the multiplexer selects the inverted clock signal to be delayed by the second delay cell for usage of calibrating the input calibration signal.

9. The frequency multiplier of claim 1, further comprising:

a third calibration circuit, comprising:

a third delay cell, configured to provide a third delay;

wherein after the target delay is found, the first delay cell is repeatedly used M/4 times for delaying the input calibration signal or the derivative thereof by M/4 times the target delay, to generate a third delayed signal; and the controller controls the third calibration circuit according to the third delayed signal, to make the third delay be equal to M/4 times the target delay.

10. The frequency multiplier of claim 1, further comprising:

at least one exclusive-OR (XOR) logic circuit, coupled to the first calibration circuit, configured to perform at least one XOR operation on the input calibration signal or the derivative thereof with a final delayed signal in a normal mode of the frequency multiplier, to generate an output signal with a multiplied frequency, wherein the final delayed signal is generated by using the first delay cell M/4 times, for delaying the input calibration signal by M/4 times the target delay; or the final delayed signal is generated by using the first delay cell M/8 times, for delaying the derivative of the input calibration signal by M/8 times the target delay.

11. A delay-reused duty cycle calibration method, comprising:

coupling an output terminal of a first delay cell to an input terminal of the first delay cell by a first calibration circuit, wherein the first calibration circuit comprises the first delay cell, the first delay cell is configured to provide a first delay, and the first delay cell is repeatedly used M times for delaying an input calibration signal or a derivative thereof by M times the first delay, to generate a first delayed signal, wherein M is a predetermined positive integer;

controlling the first delay by a controller according to the first delayed signal, to find a target delay of the first delay cell which makes M times the target delay be equal to one cycle period of an input clock signal, wherein the input calibration signal is generated by a second calibration circuit according to the input clock signal;

after the target delay is found, repeatedly using the first delay cell M/2 times for delaying the input calibration signal or the derivative thereof by M/2 times the target delay, to generate a second delayed signal; and controlling the second calibration circuit according to the second delayed signal to make the input calibration signal have a target duty cycle;

wherein controlling the first delay by the controller according to the first delayed signal to find the target delay comprises:

detecting a phase difference between a delayed edge of the first delayed signal and a target edge of the input calibration signal; and controlling the first delay to make the delayed edge of the first delayed signal be aligned with the target edge of the input calibration signal.

12. The delay-reused duty cycle calibration method of claim 11, wherein coupling the output terminal of the first delay cell to the input terminal of the first delay cell comprises:

coupling the output terminal of the first delay cell to the input terminal of the first delay cell to make a signal on the output terminal of the first delay cell be fed back to the input terminal of the first delay cell.

13. The delay-reused duty cycle calibration method of claim 11, wherein the delayed edge of the first delayed signal is generated by delaying a first edge of the input calibration signal or the derivative thereof, and the target edge of the input calibration signal is a second edge that is one cycle period later than the first edge.

14. The delay-reused duty cycle calibration method of claim 11, wherein the output terminal of the first delay cell is coupled to a counter, and the delayed edge of the first delayed signal is generated by the counter when the first delay cell has been repeatedly used M times.

15. The delay-reused duty cycle calibration method of claim 11, wherein the second calibration circuit comprises a second delay cell configured to provide a second delay, and controlling the second calibration circuit according to the second delayed signal to make the input calibration signal have the target duty cycle comprises:

controlling the second delay according to the second delayed signal to make the input calibration signal have the target duty cycle.

16. The delay-reused duty cycle calibration method of claim 15, wherein the second delay cell comprises a unit delay element configured to provide a unit delay, an output terminal of the unit delay element is coupled to an input terminal of the unit delay element, and controlling the second delay comprises:

repeatedly using the unit delay element N times for making the second delay be equal to N times the unit delay, wherein N is a positive integer corresponding to a digital code controlled by the controller.

17. The delay-reused duty cycle calibration method of claim 15, where the second calibration circuit further comprises a multiplexer and an inverter, the inverter is configured to generate an inverted clock signal according to the input clock signal, and controlling the second calibration circuit according to the second delayed signal to make the input calibration signal have the target duty cycle further comprises:

selecting one of the input clock signal and the inverted clock signal by the multiplexer according to a comparison between a current duty cycle of the input clock signal and the target duty cycle for being sent to the second delay cell.

18. The delay-reused duty cycle calibration method of claim 17, wherein selecting one of the input clock signal and the inverted clock signal to the second delay cell by the multiplexer according to the comparison between the current duty cycle of the input clock signal and the target duty cycle comprises:

in response to the comparison indicating that the current duty cycle is greater than the target duty cycle, selecting the input clock signal to be delayed by the second delay cell for usage of calibrating the input calibration signal.

19. The delay-reused duty cycle calibration method of claim 17, wherein selecting one of the input clock signal and the inverted clock signal to the second delay cell by the multiplexer according to the comparison between the current duty cycle of the input clock signal and the target duty cycle comprises:

in response to the comparison indicating that the current duty cycle is less than the target duty cycle, selecting the inverted clock signal to be delayed by the second delay cell for usage of calibrating the input calibration signal.

20. The delay-reused duty cycle calibration method of claim 11, further comprising:

after the target delay is found, repeatedly using the first delay cell M/4 times for delaying the input calibration signal or the derivative thereof by M/4 times the target delay, to generate a third delayed signal; and controlling a third calibration circuit according to the third delayed signal to make a third delay cell within the third calibration provide a third delay equal to M/4 times the target delay.

21. The frequency multiplier of claim 1, wherein the output terminal of the first delay cell is coupled to the input terminal of the first delay cell by a multiplexer.

22. The delay-reused duty cycle calibration method of claim 11, wherein coupling the output terminal of the first delay cell to the input terminal of the first delay cell comprises:

coupling the output terminal of the first delay cell to the input terminal of the first delay cell by a multiplexer.

* * * * *